(12) United States Patent
Enomura

(10) Patent No.: US 10,364,508 B2
(45) Date of Patent: Jul. 30, 2019

(54) METHOD FOR PRODUCING SINGLE CRYSTALLINE ZINC OXIDE NANOPARTICLES

(71) Applicant: M. TECHNIQUE CO., LTD., Izumi-shi, Osaka (JP)

(72) Inventor: Masakazu Enomura, Izumi (JP)

(73) Assignee: M. TECHNIQUE CO., LTD., Izumi-Shi, Osaka (JP)

( * ) Notice: Subject to any disclaimer, the term of this patent is extended or adjusted under 35 U.S.C. 154(b) by 282 days.

(21) Appl. No.: 15/320,226

(22) PCT Filed: Jul. 14, 2015

(86) PCT No.: PCT/JP2015/070105
§ 371 (c)(1),
(2) Date: Dec. 19, 2016

(87) PCT Pub. No.: WO2016/010018
PCT Pub. Date: Jan. 21, 2016

(65) Prior Publication Data
US 2017/0130358 A1 May 11, 2017

(30) Foreign Application Priority Data
Jul. 14, 2014 (JP) .................................. 2014-144526

(51) Int. Cl.
*C30B 29/16* (2006.01)
*C30B 7/14* (2006.01)
(Continued)

(52) U.S. Cl.
CPC ................ *C30B 7/14* (2013.01); *B82Y 40/00* (2013.01); *C01G 9/02* (2013.01); *C30B 29/16* (2013.01);
(Continued)

(58) Field of Classification Search
CPC .............. C30B 7/10; C30B 7/14; C30B 29/16
See application file for complete search history.

(56) References Cited

U.S. PATENT DOCUMENTS

2010/0155310 A1 6/2010 Enomura
2010/0319785 A1 12/2010 Endmura
(Continued)

FOREIGN PATENT DOCUMENTS

CN 101784346 A 7/2010
CN 102905783 A 1/2013
(Continued)

OTHER PUBLICATIONS

Extended European Search Report, dated Feb. 13, 2018, for European Application No. 15822122.6.

*Primary Examiner* — Robert M Kunemund
(74) *Attorney, Agent, or Firm* — Birch, Stewart, Kolasch & Birch, LLP

(57) ABSTRACT

A method for producing single crystalline zinc oxide nanoparticles that is capable of mass production includes mixing, between processing surfaces which are disposed in a position facing each other so as to be able to approach and separate from each other and rotate relative to each other, a zinc oxide separating solvent prepared by homogeneously mixing an acidic substance with a solvent containing at least alcohol and a raw material solution obtained by mixing a zinc oxide nanoparticle raw material with a basic solvent or a raw material solution that is basic as a result of mixing and dissolving a zinc oxide nanoparticle raw material with and into a solvent, and discharging a mixed fluid in which zinc oxide nanoparticles have separated out from between the processing surfaces. The zinc oxide separating solvent and the raw material solution are mixed between the processing surfaces so that the mixed fluid becomes basic, and zinc
(Continued)

oxide nanoparticles are generated by an acid-base reaction due to mixing of the acidic substance and the basic solvent.

20 Claims, 11 Drawing Sheets

(51) Int. Cl.
    *B82Y 40/00*     (2011.01)
    *C01G 9/02*     (2006.01)
    *C30B 29/60*     (2006.01)
    *B82Y 30/00*     (2011.01)

(52) U.S. Cl.
    CPC ............... *C30B 29/60* (2013.01); *B82Y 30/00* (2013.01); *C01P 2002/60* (2013.01); *C01P 2002/72* (2013.01); *C01P 2004/04* (2013.01); *C01P 2004/64* (2013.01); *Y10S 977/773* (2013.01); *Y10S 977/896* (2013.01)

(56) References Cited

U.S. PATENT DOCUMENTS

| | | | |
|---|---|---|---|
| 2010/0322997 A1 | 12/2010 | Enomura | |
| 2011/0015054 A1 | 1/2011 | Enomura | |
| 2013/0034490 A1 | 2/2013 | Enomura | |
| 2013/0156682 A1 | 6/2013 | Kuraki et al. | |
| 2013/0333520 A1 | 12/2013 | Enomura | |
| 2013/0343979 A1 | 12/2013 | Kuraki et al. | |
| 2014/0001663 A1 | 1/2014 | Kuraki et al. | |
| 2014/0155247 A1 | 6/2014 | Aoyagi et al. | |
| 2015/0321154 A1 | 11/2015 | Enomura | |

FOREIGN PATENT DOCUMENTS

| | | |
|---|---|---|
| CN | 103282145 A | 9/2013 |
| EP | 2610215 A1 | 7/2013 |
| EP | 2690079 A1 | 1/2014 |
| JP | 2008-303111 A | 12/2008 |
| JP | 2009-82902 A | 4/2009 |
| JP | 2009-132596 A | 6/2009 |
| JP | 2010-120786 A | 6/2010 |
| JP | 2011-84465 A | 4/2011 |
| JP | 5147091 B1 | 2/2013 |
| WO | WO 2009/008391 A1 | 1/2009 |
| WO | WO 2009/008392 A1 | 1/2009 |
| WO | WO 2009/008393 A1 | 1/2009 |
| WO | WO 2012/127669 A1 | 9/2012 |
| WO | WO 2012/128273 A1 | 9/2012 |
| WO | WO 2013/008706 A1 | 1/2013 |

(A)

(B)

METHOD FOR PRODUCING SINGLE CRYSTALLINE ZINC OXIDE NANOPARTICLES

TECHNICAL FIELD

The present invention relates to a method for producing single crystalline zinc oxide nanoparticles.

BACKGROUND ART

Zinc oxide nanoparticles have been used broadly in semiconductors, catalysts, optical devices, sensors, pigment, cosmetics, pharmaceutical products, etc. Because the characteristics of zinc oxide itself are obvious due to single crystallization, practical use in various fields by taking advantage of these characteristics has been expected.

As methods for producing single crystals of zinc oxide nanoparticles, the following methods are known: a method using a sputtering apparatus (Patent Document 1), a method for obtaining single crystals of zinc oxide nanoparticles by spraying a zinc oxide precursor solution into a mixing chamber and making the same contact a pulse combustion gas and simultaneously therewith causing thermal treatment under a high-temperature atmosphere (Patent Document 2), and a method of immersing a substrate having a crystal face containing a metal-containing material in a reaction solution in which zinc oxide can separate out to separate single crystalline zinc oxide and isolating the separated-out single crystalline zinc oxide from the substrate for producing zinc oxide particles (Patent Document 3).

In Patent Documents 1 and 2, the methods are by so-called gas-phase methods, and cannot be said to be suitable for mass production in terms of production cost because the amount of nanoparticles generated per time is small, a high-energy system by an electron beam, plasma, laser light, induction heating, or the like is necessary for evaporating the raw material, and the yield is also low. Moreover, because nanoparticles obtained by these gas-phase methods are microparticles of pure substances and are therefore likely to aggregate and fuse, there is a problem of variation in particle size.

Also, in Patent Document 3, for obtaining single crystalline nanoparticles, a post-process for cutting off zinc oxide crystals having separated out on the substrate from the base using laser irradiation, vibration, ultrasonic waves, or a nanocutter or for dissolving and removing only the substrate on which zinc oxide crystals have separated out is necessary, and the production efficiency is unsatisfactory.

On the other hand, it is also known (Patent Document 4) to obtain single crystals of biologically ingestible nanoparticles by separating nanoparticles between processing surfaces arranged so as to be able to approach and separate from each other and rotate relative to each other.

In Patent Document 4, the point of forming a forced thin film of two kinds or more of fluids to be processed between processing surfaces arranged so as to be able to approach and separate from each other and rotate relative to each other and generating single crystals of biologically ingestible microparticles in this forced thin film is described. However, it was feasible to apply the invention disclosed in Patent Document 4 when producing zinc oxide nanoparticles that are completely different in physical properties as single crystal nanoparticles.

Further, in Patent Document 5 and Patent Document 6, it is disclosed to form a forced thin film of two kinds or more of fluids to be processed between processing surfaces arranged so as to be able to approach and separate from each other and rotate relative to each other and adjust the pH of the fluids to be processed when discharging a fluid containing nanoparticles. However, in both inventions, the pH of fluids before mixing is adjusted and not the pH of a fluid after mixing. Therefore, even when the pH of fluids before mixing is adjusted, single crystalline zinc oxide nanoparticles are not separated if the pH of a fluid after mixing has a value out of the basicity because of other reaction conditions.

It is disclosed in Patent Document 7 to generate ceramic microparticles controlled in crystallinity between processing surfaces which are disposed facing each other so as to be able to approach and separate from each other, at least one of which rotates relative to the other.

In this case, between the processing surfaces, first, a fluid containing a ceramic raw material solution obtained by mixing a ceramic raw material with and/or dissolved into a basic solvent and a fluid containing a ceramic microparticle separating solvent are mixed to separate ceramic microparticles. Then, in the next process, the crystallinity of the ceramic microparticles separated in the first process is controlled by using heat of reaction generated by mixing a fluid containing the separated ceramic microparticles and an acidic substance.

However, in Patent Document 7, using heat of reaction when separating microparticles is not described, and it was impossible to produce single crystals of zinc oxide nanoparticles in a stable manner. In Examples of Patent Document 7, lattice fringes are unclear as shown in FIG. 5, and the microparticles cannot be said to be single crystals. Additionally, the reaction conditions described in Example 2 of Patent Document 7 are not ones under which so large an amount of energy that single crystals of zinc oxide nanoparticles are generated between processing surfaces is input.

PRIOR ART DOCUMENTS

Patent Document

Patent Document 1: Japanese Patent Laid-Open Publication No. 2010-120786
Patent Document 2: Japanese Patent Laid-Open Publication No. 2008-303111
Patent Document 3: Japanese Patent Laid-Open Publication No. 2011-84465
Patent Document 4: International Patent Laid-Open Publication No. WO 2009/008391
Patent Document 5: Japanese Patent Laid-Open Publication No. 2009-82902
Patent Document 6: International Patent Laid-Open Publication No. WO 2009/008392
Patent Document 7: International Patent Laid-Open Publication No. WO 2012/127669

SUMMARY OF THE INVENTION

Problems to be Solved by the Invention

It is an object of the present invention to stably provide a method for producing single crystalline zinc oxide nanoparticles suitable for mass production, by separating single crystalline zinc oxide nanoparticles from a thin film fluid formed between at least two processing surfaces which are disposed facing each other so as to be able to approach and separate from each other, at least one of which rotates relative to the other.

Means for Solving the Problems

The presently applied invention provides a method for producing single crystalline zinc oxide nanoparticles comprising preparing a zinc oxide separating solvent by homogeneously mixing an acidic substance with a solvent containing at least alcohol, mixing, between processing surfaces which are disposed facing each other so as to be able to approach and separate from each other and rotate relative to each other, the prepared zinc oxide separating solvent and a raw material solution that is obtained by mixing a zinc oxide nanoparticle raw material with a basic solvent, or that is basic as a result of mixing and dissolving a zinc oxide nanoparticle raw material with and into a solvent, and discharging a mixed fluid in which zinc oxide nanoparticles have separated out from between the processing surfaces, wherein the zinc oxide separating solvent and the raw material solution are mixed between the processing surfaces so that the mixed fluid becomes basic, and zinc oxide nanoparticles are generated by an acid-base reaction due to mixing of the acidic substance and the basic solvent.

In the present invention, a nanoparticle means a minute particle on the order of 100 nm or less. Its shape is not particularly restricted, but may be, for example, a substantially spherical shape, a substantially disk shape, a substantially triangular prism shape, a substantially rectangular prism shape, a substantially polyhedral shape, a substantially oval spherical shape, a substantially columnar shape, or the like.

In addition, the presently applied invention may be executed as an embodiment wherein the mixed fluid has a pH of 8.6 or more and 14 or less, and preferably a pH of 12 or more and 14 or less.

In addition, the presently applied invention may be executed as an embodiment wherein the zinc oxide separating solvent has a pH of less than 1, and the raw material solution has a pH of more than 14.

In addition, the presently applied invention may be executed by using the acidic substance, which is selected from any one kind of hydrochloric acid, nitric acid, and sulfuric acid, and may be executed by using the alcohol, which is selected from any one kind of methanol, ethanol, isopropyl alcohol, and tert-butanol.

In addition, in the presently applied invention, the raw material solution may be prepared at 50° C. or more.

In addition, the presently applied invention may be executed as an embodiment wherein, for the basic solvent, a basic hydroxide is mixed with and/or dissolved into a solvent, and may be executed by using, as an alkali metal hydroxide being the basic hydroxide, any one kind of sodium hydroxide, potassium hydroxide, and lithium hydroxide.

In addition, the presently applied invention may be executed as an embodiment wherein the zinc oxide nanoparticle raw material is a zinc compound soluble in the basic solvent, and may be executed by using the zinc compound, which is selected from at least any one kind of zinc oxide, zinc chloride, zinc nitride, zinc hydroxide, and zinc sulfide.

In addition, the presently applied invention may be executed as an embodiment wherein the raw material solution passes through between the processing surfaces while forming a thin film fluid, the zinc oxide separating solvent is introduced from an opening formed in at least any one of the processing surfaces between the processing surfaces through a separate introduction path independent of the flow path through which the raw material solution is introduced between the processing surfaces, and the zinc oxide separating solvent and the raw material solution are mixed between the processing surfaces. In addition, the presently applied invention may be executed as an embodiment wherein, conversely, the zinc oxide separating solvent passes through between the processing surfaces while forming a thin film fluid, the raw material solution is introduced from an opening formed in at least any one of the processing surfaces between the processing surfaces through a separate introduction path independent of the flow path through which the zinc oxide separating solvent is introduced between the processing surfaces, and the zinc oxide separating solvent and the raw material solution are mixed between the processing surfaces.

In addition, the presently applied invention may be executed as an embodiment which homogeneously mixes the acidic substance with the solvent containing at least alcohol using a rotary disperser, wherein the rotary disperser includes a rotor provided with a plurality of blades and a screen laid around the rotor and having a plurality of slits, and by the rotor and the screen rotating relative to each other, shear of a fluid is performed in a minute gap between an inner wall of the screen including the slit and the blade, and the fluid is discharged through the slit from inside to outside of the screen as an intermittent jet flow.

In addition, the zinc oxide nanoparticles to be generated may be controlled in single crystal ratio by a preparation temperature of the zinc oxide separating solvent, and the zinc oxide nanoparticles to be generated may be controlled in single crystal ratio by stirring energy that is input during preparation of the zinc oxide separating solvent. Here, the single crystal ratio is calculated, as a result of observing generated zinc oxide nanoparticles by an electron microscope, by single crystal ratio=$B/A \times 100(\%)$ based on the number A of observed zinc oxide nanoparticles and the number B of zinc oxide nanoparticles observed as single crystals therein.

Moreover, the zinc oxide separating solvent may be prepared at 40° C. or more, and a preparation time of 20 minutes or more may be set for the zinc oxide separating solvent.

Effects of the Invention

The presently applied invention could stably provide a method for producing single crystalline zinc oxide nanoparticles suitable for mass production without the necessity of a high-energy system by an electron beam, plasma, laser light, induction heating, or the like to evaporate the raw material.

This is a front view showing the usage state of a rotary disperser to be used for carrying out the said fluid processing method.

FIG. 2

This is an enlarged longitudinal section view of the essential part of the said rotary disperser.

FIG. 3

This is a rough cross-section view of the fluid processing apparatus to be used for carrying out the fluid processing method according to an embodiment of the present invention.

FIG. 4

Figure 3:
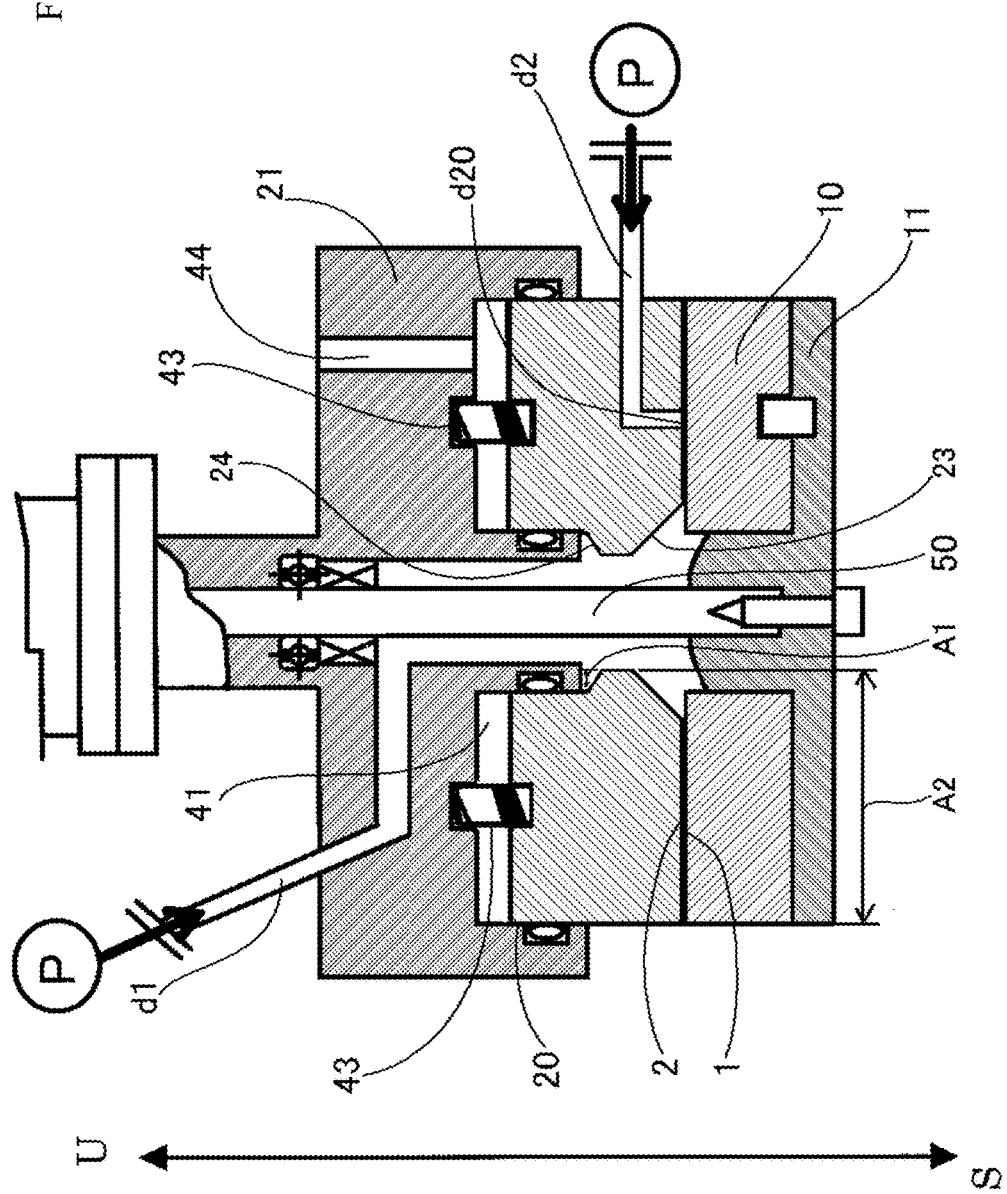

FIG. 4(A) is a rough top view of the first processing surface of the fluid processing apparatus shown in FIG. 3, and FIG. 4(B) is an enlarged drawing of the essential part of the processing surface of the said apparatus.

FIG. 5

FIG. 5(A) is a cross-section view of the second introduction part of the said apparatus, and FIG. 5(B) is an enlarged drawing of the essential part of the processing surface for explaining the said second introduction part.

FIG. 6

Figure 6:
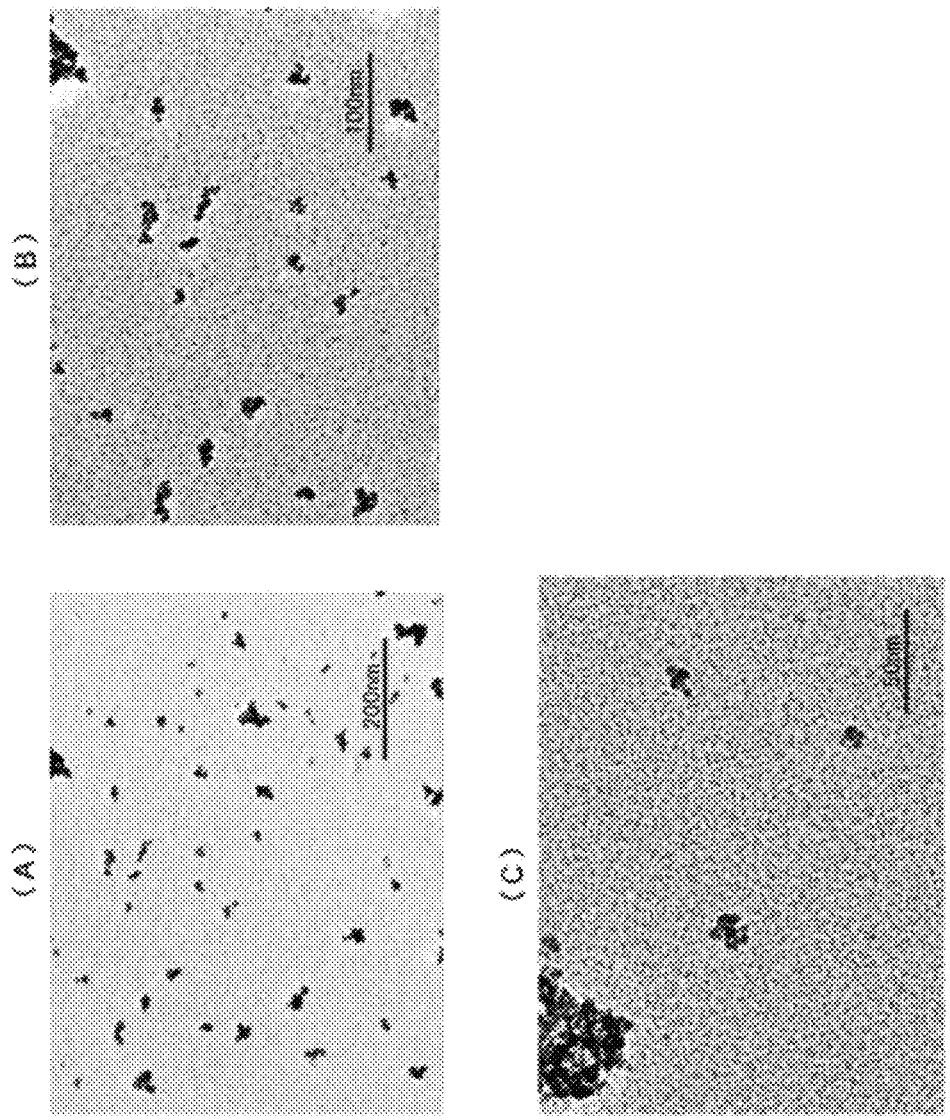

FIG. 6(A) to FIG. 6(C) are TEM pictures of the zinc oxide nanoparticles prepared in Example 1.

FIG. 7

This is a STEM picture of the zinc oxide nanoparticle prepared in Example 1.

FIG. 8

This shows the XRD measurement results of the zinc oxide nanoparticles prepared in Example 1.

FIG. 9

This is a STEM picture of the zinc oxide nanoparticle prepared in Example 2.

FIG. 10

This is a STEM picture of the zinc oxide nanoparticle prepared in Example 3.

FIG. 11

This is a graph showing the relationship of the preparation temperature of a raw material solution and the single crystal ratio.

EMBODIMENTS FOR CARRYING OUT THE INVENTION

Hereunder, one embodiment of the presently applied invention will be raised and explained based on the drawings.

Acidic Substances:

An illustrative example of an acidic substance includes inorganic acids such as aqua regia, hydrochloric acid, nitric acid, fuming nitric acid, sulfuric acid, and fuming sulfuric acid; and organic acids such as formic acid, acetic acid, chloroacetic acid, dichloroacetic acid, oxalic acid, trifluoroacetic acid, and trichloroacetic acid.

Solvent Containing at Least Alcohol:

To prepare a zinc oxide separating solvent, the above-mentioned acidic substance is homogeneously mixed with a solvent containing at least alcohol.

An illustrative example of the alcohol includes linear alcohols such as methanol, ethanol, n-propanol, and n-butanol, branched alcohols such as isopropanol, 2-butanol, tert-butanol, and 1-methoxy-2-propanol, and polyalcohols such as ethylene glycol and diethylene glycol.

Zinc Oxide Separating Solvent:

A zinc oxide separating solvent can be prepared by homogeneously mixing an acidic substance with a solvent containing at least the abovementioned alcohol. In addition, a process (hereinafter, a preparation step) for preparing a zinc oxide separating solvent by homogeneously mixing an acidic substance with a solvent containing at least the abovementioned alcohol will be described later. In this case, the zinc oxide separating solvent is preferably prepared at 40° C. or more, and the preparation time of the zinc oxide separating solvent is preferably set to 20 minutes or more. The pH of the zinc oxide separating solvent is preferably less than 1.

Zinc Oxide Nanoparticle Raw Materials:

There are no restrictions as to the raw material of zinc oxide nanoparticles, and a zinc single body and a compound thereof may be used. An illustrative example thereof includes zinc in the form of oxides, nitrides, sulfides, salts (such as nitrate salts, sulfate salts, chlorides, phosphate salts, and carbonates), hydroxides, complexes, and their hydrates and organic solvates; a zinc compound that is soluble in a basic solvent to be described later is preferable, and zinc oxide, zinc chloride, zinc nitride, zinc hydroxide, zinc nitride, and their hydrates are preferably used. These zinc oxide nanoparticle raw materials may be used solely or as a combination of two or more of them.

Basic Solvent:

As a basic solvent, the following basic substance is preferably dissolved into a solvent to carry out the present invention.

An illustrative example of the basic substance includes metal hydroxides such as sodium hydroxide and potassium hydroxide, metal alkoxides such as sodium methoxide and sodium isopropoxide, and amine compounds such as triethylamine, 2-diethylaminoethanol, and diethylamine.

As the solvent to mix and dissolve the basic substance, water, an organic solvent, or a mixture of them may be exemplified. An illustrative example of the water includes a tap water, an ion-exchanged water, a purified water, a ultrapurified water, and a RO water; and an illustrative example of the organic solvent includes an alcohol compound solvent, an amide compound solvent, a ketone compound solvent, an ether compound solvent, an aromatic compound solvent, carbon disulfide, an aliphatic compound solvent, a nitrile compound solvent, a sulfoxide compound solvent, a halogen compound solvent, an ester compound solvent, an ionic liquid, a carboxylic acid compound, and a sulfonic acid compound. These solvents each may be used solely or as a mixture of two or more of them.

As the basic solvent, the afore-mentioned basic substance mixed with and dissolved into the afore-mentioned solvent to be a basic solvent may be used, and the present invention may also be carried out when the zinc oxide nanoparticle raw material is mixed with and dissolved into the afore-mentioned solvent to show basicity in a resulting raw material solution; but as the basic solvent, a basic hydroxide such as a hydroxide of an alkali metal or a hydroxide of an alkaline earth metal is preferably mixed with and dissolved into the afore-mentioned solvent. Moreover, the basic hydroxide is preferably alkali metal hydroxide, and more preferably, sodium hydroxide, potassium hydroxide, or lithium hydroxide.

Raw Material Solution:

The zinc oxide nanoparticle raw material is preferably dissolved into the basic solvent to obtain a raw material solution. Meanwhile, at the time of mixing or dissolution, similarly to the zinc oxide separating solvent, both are homogeneously mixed by a preparation step to be described later. In this case, the raw material solution is preferably prepared at 50° C. or more, and more preferably prepared at 75° C. or more. The pH of the raw material solution is preferably more than 14.

Dispersant and so Forth:

In the present invention, various dispersing agents and surfactants may be used in accordance with the object and the necessity. Though not particularly restricted, various commercially available general surfactants and dispersing agents as well as a newly synthesized substance may be used. An illustrative example thereof includes an anionic surfactant, a cationic surfactant, a nonionic surfactant, as well as a dispersing agent such as various kinds of polymers. These may be used solely or as a combination of two or more of them.

The afore-mentioned surfactant and dispersant may be contained in either or both of the material fluid and the zinc oxide separating solvent. Alternatively, the afore-mentioned surfactant and dispersant may be contained in a third fluid which is different from the raw material solution fluid and zinc oxide separating solvent.

Preparation Step:

The preparation step for preparing the zinc oxide separating solvent is preferably by homogeneously mixing the acidic substance with the solvent containing at least alcohol using a rotary disperser to be described later. Using a rotary disperser enables easily effecting homogeneous mixing.

As the rotary disperser, one that realizes homogeneous mixing by, for example, applying a shearing force to fluid is preferably used, such as one that rotates in a tank a stirrer having any of various shapes such as a bar shape, a plate shape, or a propeller shape, or one provided with a screen that rotates relative to the stirrer. As a preferred example of the rotary disperser, the stirring apparatus disclosed in Japanese Patent No. 5147091 can be applied.

The rotary disperser may also be by a batch method or may also be by a continuous method. In the case by a continuous method, a fluid supply and discharge to and from a stirring tank may be carried out continuously, or may be performed using a continuous type mixer without using a stirring tank.

Figure 1:
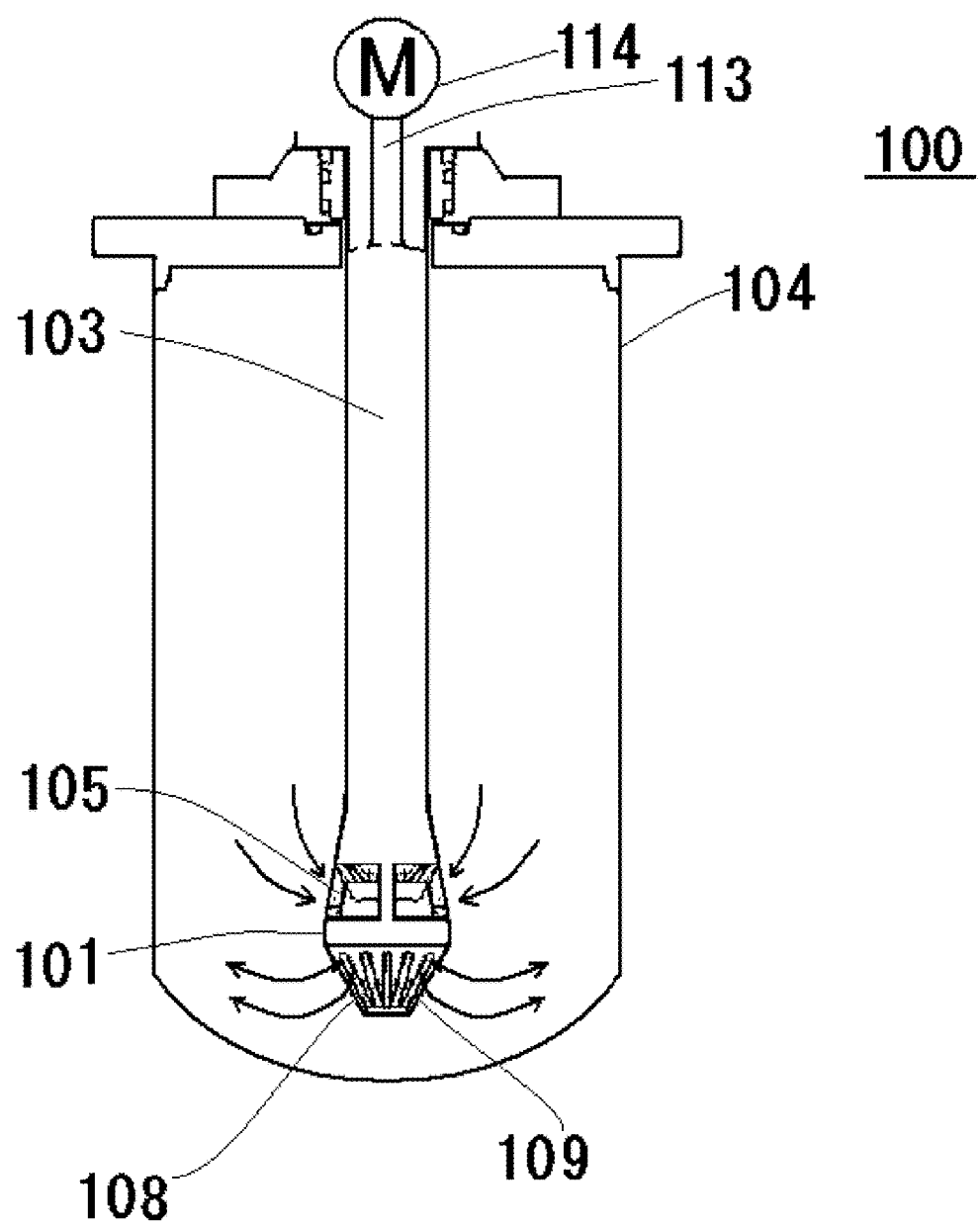
FIG. 1
Figure 2:
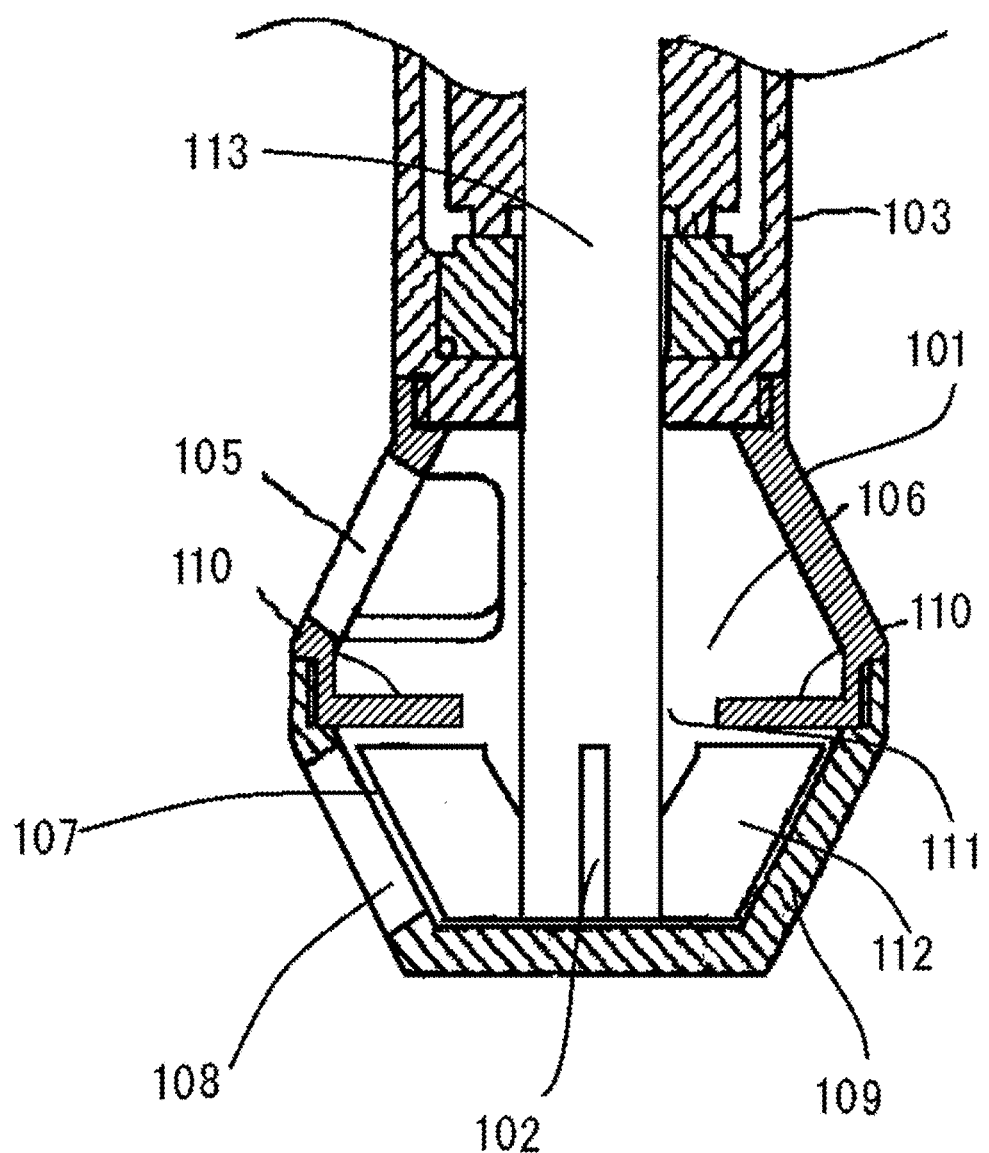

Explanation of FIG. 1 and FIG. 2

As shown in FIG. 1 and FIG. 2, in a fluid container 104 of a rotary disperser 100 according to this embodiment, a mixture of an acidic substance and a solvent containing at least alcohol, which is a fluid to be processed, is stored. The rotary disperser 100 is provided with a processing member 101 to be disposed in the fluid to be processed and a rotor 102 arranged in the processing member 101.

The processing member 101 is a hollow housing, and by being supported by a support pipe 103, disposed in the fluid container 104 storing the fluid to be processed. In this example, the processing member 101 is shown which is provided at the front end of the support tube 103 and inserted from an upper portion of the fluid container 104 into a lower side of the interior, but is not limited to this example, and even a processing member 101 which is supported so as to project upward from a bottom face of the fluid container 104 may be used.

The processing member 101 is provided with an intake chamber 106 having an intake port 105 to take the fluid to be processed into the inside from the outside and a stirring chamber 107 communicating with the intake chamber 106. The stirring chamber 107 is defined at its outer periphery by a screen 109 having a plurality of slits 108 serving as discharge ports.

The intake chamber 106 and the stirring chamber 107 are sectioned from each other by a partition wall 110 that is a sectioning member between both chambers 106 and 107, and communicate with each other via an opening 111 for introduction provided in the partition wall 110.

Meanwhile, in the example shown in FIG. 2, the support tube 103 is screwed at its front end (lower end in the figure) with the base end (upper end in the figure) of the intake chamber 106, the intake chamber 106 is screwed at its front end with the base end of the stirring chamber 107 (screen 109), and the partition wall 110 is integrally formed at the lower end of the intake chamber 106, but these members can be variously changed in construction and coupling state.

The abovementioned rotor 102 is a rotating body provided circumferentially with a plurality of stirring blades 112, and rotates while keeping a minute clearance between the stirring blades 112 and the screen 109. Various rotary drive structures can be used for the structure to rotate the rotor 102, and in this example, the rotor 102 is provided at the front end of a rotary shaft 113 and rotatably accepted in the stirring chamber 107. In greater detail, the rotary shaft 113 is inserted through the inside of the support tube 103. Further, the rotary shaft 113 is disposed so as to reach, from the intake chamber 106, the stirring chamber 107 through the opening 111 in the partition wall 110, and has the rotor 102 attached at its front end (lower end in the figure). Therefore, this rotary shaft 113 serves as a penetrating member that penetrates through the opening 111.

The base end of the rotary shaft 113 is connected to a rotary drive unit such as a motor 114. As the motor 114, one having a control system by numerical control or the like or one that is placed under computer control is preferably used.

With this rotary disperser 100, by the rotor 102 rotating, mixing is effected by a shearing force that is applied, when the rotating stirring blades 112 pass by the inner wall surface of the screen 109, to a fluid to be processed present therebetween. A kinetic energy is therewith given to the fluid to be processed by the rotation of the rotor 102, and this fluid to be processed is further accelerated by passing through the slits 108, and flows out of the stirring chamber 107 while forming an intermittent jet flow. Liquid-liquid shearing forces being generated at velocity interfaces due to the intermittent jet flow also effect a more uniform dispersion or mixing processing.

The detailed mechanism is not known, but when preparing a zinc oxide separating solvent, non-single crystalline zinc oxide nanoparticles are separated unless an acidic substance is homogeneously mixed with a solvent containing at least alcohol.

Separation Step:

In the presently applied invention, single crystals of zinc oxide nanoparticles are prepared by carrying out a process (hereinafter, a "separation step") of separating single crystalline zinc oxide nanoparticles by mixing a prepared zinc oxide separating solvent and raw material solution by a fluid processing apparatus provided with processing surfaces which are disposed in a position facing each other so as to be able to approach and separate from each other and rotate relative to each other. Hereunder, an embodiment of the afore-mentioned fluid processing apparatus that is applicable when carrying out the separation step will be explained.

Figure 4:
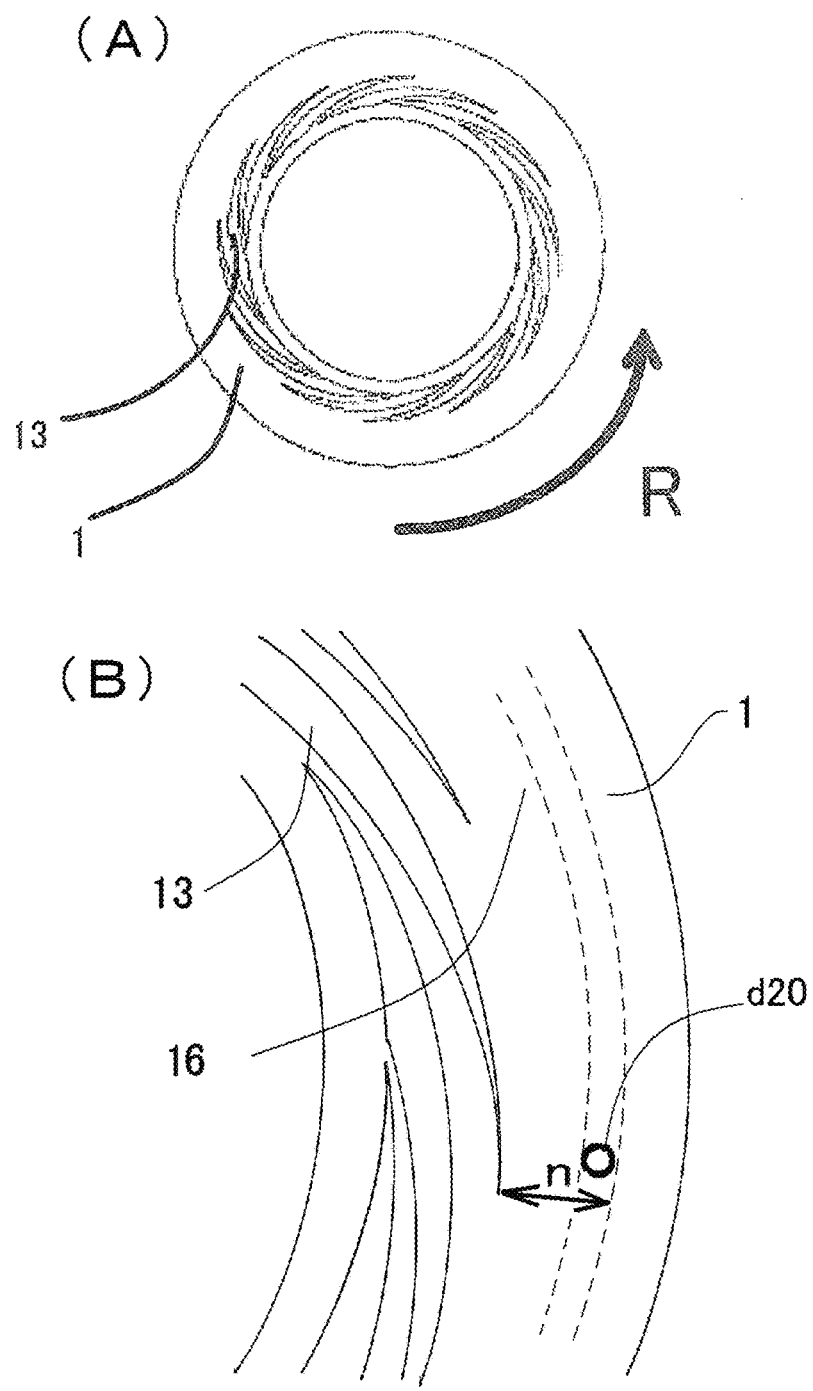
Figure 5:
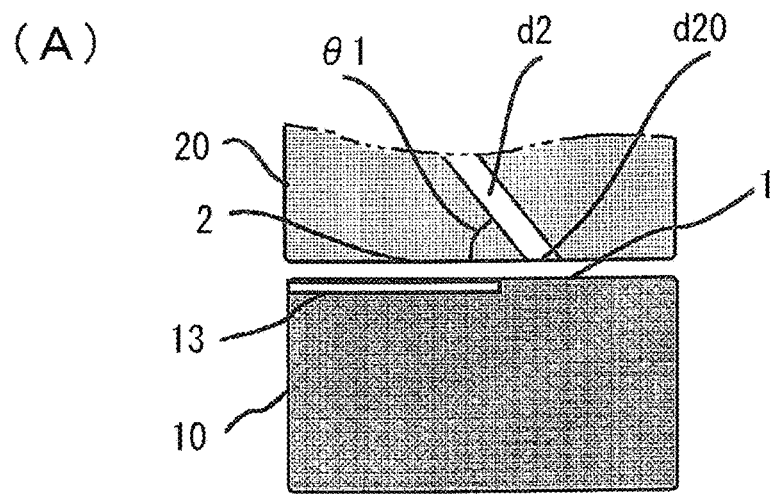
Figure 5:
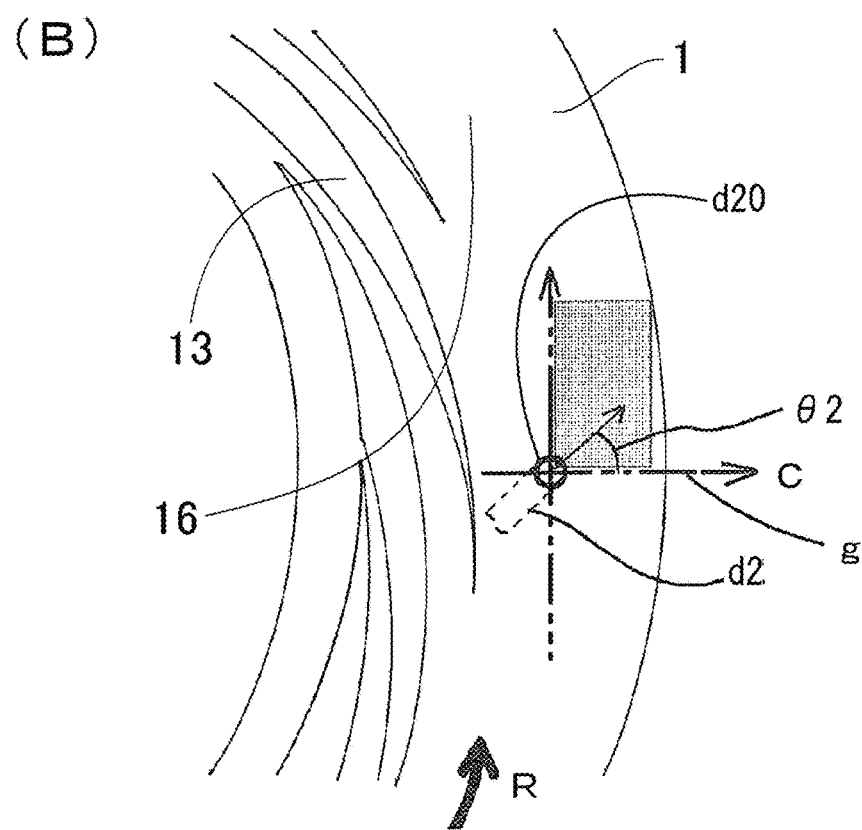

The fluid processing apparatus shown in FIG. 3 to FIG. 5 is similar to the apparatus described in Patent Document 4. In FIG. 3, a reference character U indicates an upside and a reference character S indicates a downside; however, up and down, front and back and right and left shown therein indicate merely a relative positional relationship and does not indicate an absolute position. In FIG. 4(A) and FIG. 5(B), reference character R indicates a rotational direction. In FIG. 5(B), reference character C indicates a direction of centrifugal force (a radius direction).

This fluid processing apparatus is provided with two processing members of a first processing member 10 and a second processing member 20 arranged opposite to each other, wherein at least one of these processing members rotates. The surfaces arranged opposite to each other of the respective processing members 10 and 20 are made to be the respective processing surfaces. The first processing member 10 is provided with a first processing surface 1 and the second processing member 20 is provided with a second processing surface 2.

The processing surfaces 1 and 2 are connected to a flow path of the fluid to be processed and constitute part of the flow path of the fluid to be processed. Distance between these processing surfaces 1 and 2 can be changed as appropriate; and thus, the distance thereof is controlled so as to form a minute space in the range of 1 mm or less, for example, 0.1 µm to 50 µm. With this, the fluid to be processed passing through between the processing surfaces 1 and 2 becomes a forced thin film fluid forced by the processing surfaces 1 and 2.

With this apparatus, when a plurality of fluids to be processed are processed, the apparatus is connected to a flow path of the first fluid to be processed whereby forming part of the flow path of the first fluid to be processed. Further in this apparatus, part of the flow path of the second fluid to be processed other than the first fluid to be processed is formed. In this apparatus, the two paths converge into one, and two fluids to be processed are mixed between the processing surfaces 1 and 2 so that a fluid processing may be effected to separate microparticles by reaction.

To specifically explain, this apparatus is provided with a first holder 11 for holding the first processing member 10, a second holder 21 for holding the second processing member 20, a surface-approaching pressure imparting mechanism, a rotation drive mechanism, a first introduction part d1, a second introduction part d2, and a fluid pressure imparting mechanism p.

As shown in FIG. 4(A), in this embodiment, the first processing member 10 is a circular body, specifically a disk with a ring form. Similarly, the second processing member 20 is a circular disk. Material of the processing members 10 and 20 is not only metal but also carbon, ceramics, sintered metal, abrasion-resistant steel, sapphire, other metal subjected to hardening treatment, and rigid material subjected to lining, coating, or plating. In the processing members 10 and 20 of this embodiment, the first and the second surfaces 1 and 2 arranged opposite to each other is mirror-polished, and arithmetic average roughness is not particularly limited; but the roughness is preferably 0.01 µm to 1.0 µm, or more preferably 0.03 µm to 0.3 µm.

Of the first holder 11 and the second holder 21, at least one holder can rotate relative to the other holder by a rotation drive mechanism such as an electric motor (not shown in drawings).

In this embodiment, the second holder 21 is fixed to the apparatus, the first holder 11 attached to a rotary shaft 50 of the rotation drive mechanism fixed to the same apparatus rotates, and thereby the first processing member 10 attached to this first holder 11 rotates relative to the second processing member 20. As a matter of course, the second processing member 20 may be made to rotate, or the both may be made to rotate.

In this embodiment, the second processing member 20 approaches and separates from the first processing member 10 in the direction of the rotary shaft 50, wherein a side of the second processing member 20 opposite to the second processing surface 2 is accepted in an accepting part 41 arranged in the second holder 21 so as to be able to rise and set. However, in contrast to the above, the first processing member 10 may approach and separate from the second processing member 20, or both the processing members 10 and 20 may approach and separate from each other.

This accepting part 41 is a concave portion for accepting the side of the second processing member 20 opposite to the second processing surface 2, and this concave portion is a groove being formed into a ring. This accepting part 41 accepts the second processing member 20 with sufficient clearance so that the side of the second processing member 20 opposite to the second processing surface 2 may rise and set. Meanwhile, the second processing member 20 may be arranged so as to be movable only parallel to the axial direction; alternatively, the second processing member 20 may be made movable, by making this clearance larger, relative to the accepting part 41 so as to make the center line of the processing member 20 inclined, namely unparallel, to the axial direction of the accepting part 41, or movable so as to deviate the center line of the processing member 20 and the center line of the accepting part 41 toward the radius direction. It is preferable that the second processing member 20 be accepted by a floating mechanism so as to be movable in the three dimensional direction, as described above.

The fluids to be processed are introduced between the processing surfaces 1 and 2 from the first introduction part d1 and the second introduction part d2, the flow paths through which the fluids flow, under the state that pressure is applied thereto by a fluid pressure imparting mechanism p consisting of a pump to be described later, potential energy, and so on. In this embodiment, the first introduction part d1 is a path arranged in the center of the circular second holder 21, and one end thereof is introduced between the processing surfaces 1 and 2 from inside the circular processing members 10 and 20. Through the second introduction part d2, the second fluid to be processed for being subjected to reaction with the first fluid to be processed is introduced between the processing surfaces 1 and 2. In this embodiment, the second introduction part d2 is a path arranged inside the second processing member 20, and one end thereof is an opening d20 formed in the second processing surface.

The first fluid to be processed which is pressurized with the fluid pressure imparting mechanism p is introduced from the first introduction part d1 to the space inside the processing members 10 and 20 so as to pass through between the first and second processing surfaces 1 and 2 to outside the processing members 10 and 20.

From the second introduction part d2, the second fluid to be processed which is pressurized with the fluid pressure imparting mechanism p is provided between the processing surfaces 1 and 2, whereat this fluid converges with the first fluid to be processed, and due to an acid-base reaction when both fluids to be processed are mixed, a fluid containing zinc oxide nanoparticles is discharged from the processing surfaces 1 and 2 to outside the processing members 10 and 20. Meanwhile, an environment outside the processing members 10 and 20 may be made negative pressure by a vacuum pump.

The surface-approaching pressure imparting mechanism mentioned above supplies the processing members with force exerting in the direction of approaching the first processing surface 1 and the second processing surface 2 each other. In this embodiment, the surface-approaching pressure imparting mechanism is arranged in the second holder 21 and biases the second processing member 20 toward the first processing member 10.

The surface-approaching pressure imparting mechanism is a mechanism to generate force (hereinafter, surface-approaching pressure) to press the first processing surface 1 of the first processing member 10 and the second processing surface 2 of the second processing member 20 in the direction to make them approach each other. The mechanism keeps the distance between the processing surfaces 1 and 2 in a predetermined minute distance and generates a thin film fluid having minute thickness in a level of nanometer or micrometer by the balance between the surface-approaching pressure and the force due to the fluid pressure to separate the processing surfaces 1 and 2 from each other.

In the embodiment shown in FIG. 3, the surface-approaching pressure imparting mechanism is arranged between the accepting part 41 and the second processing member 20.

Specifically, the surface-approaching pressure imparting mechanism is biased at the second processing member 20 toward the first processing member 10 by the resilience of a spring 43 one end of which is latched with a hole in the second holder 21 and the other end of which is latched with a hole in the second processing member and is biased toward the first processing member 10 at the second processing member 20 by the pressure of a biasing fluid such as air and oil introduced to a biasing-fluid introduction part 44, wherein the surface-approaching pressure mentioned above is provided. The surface-approaching pressure may be provided by any one of the resilience by this spring 43 and the fluid pressure of this biasing fluid; and other forces such as magnetic force and gravitation may also be used.

The second processing member 20 recedes from the first processing member 10 thereby making a minute space between the processing surfaces by separating force, caused by viscosity and the pressure of the fluid to be processed applied by the fluid pressure imparting mechanism p, against the biasing force of this surface-approaching pressure imparting mechanism. By this balance between the surface-approaching pressure and the separating force as mentioned above, the distance of the first processing surface 1 and the second processing surface 2 can be set with the precision of a micrometer level.

Meanwhile, the separating force mentioned above includes fluid pressure and viscosity of the fluid to be processed, centrifugal force by rotation of the processing members, negative pressure when negative pressure is applied to the biasing-fluid introduction part 44, and resilience when the spring 43 works as a pulling spring. This surface-approaching pressure imparting mechanism may be arranged also in the first processing member 10, in place of the second processing member 20, or in both of the processing members.

Further, the second processing member 20 has inside a separation controlling surface 23 which is next to the second processing surface 2. The separation controlling surface 23 is formed in an inverted conical surface shape, and the pressure of the fluid to be processed introduced through the first introduction part d1 acts to the separation controlling surface to generate force directing to separate the second processing member 20 from the first processing member 10.

On the other hand, the second processing member 20 has inside an approach controlling surface 24 on the side opposite to the second processing surface 2. The approach controlling surface 24 is also formed in an inverted conical surface shape, and the pressure of the fluid to be processed introduced through the first introduction part d1 acts to the approach controlling surface 24 to generate force of approaching the second processing member 20 toward the first processing member 10.

By controlling the area of the approach controlling surface 24, the force of approaching the second processing member 20 toward the first processing member 10 is controlled, thereby forming the space between the processing surfaces 1 and 2 as a desired minute space so as to form a fluid film of the fluid to be processed.

Meanwhile, the approach controlling surface 24 may have a larger area than the separation controlling surface 23, though this is not shown in the drawing.

The fluid to be processed becomes a forced thin film fluid by the processing surfaces 1 and 2 that keep the minute space therebetween, whereby the fluid is forced to move out from the circular, processing surfaces 1 and 2. However, the first processing member 10 is rotating; and thus, the mixed fluid to be processed does not move linearly from inside the circular, processing surfaces 1 and 2 to outside thereof, but does move spirally from the inside to the outside thereof by a resultant vector acting on the fluid to be processed, the vector being composed of a moving vector toward the radius direction of the circle and a moving vector toward the circumferential direction.

Meanwhile, a rotary shaft 50 is not only limited to be placed vertically, but may also be placed horizontally, or at a slant. This is because the fluid to be processed is processed in a minute space between the processing surfaces 1 and 2 so that the influence of gravity can be substantially eliminated or reduced. In addition, this surface-approaching pressure imparting mechanism can function as a buffer mechanism of micro-vibration and rotation alignment by concurrent use of the foregoing floating mechanism with which the second processing member 20 may be held displaceably.

As shown in FIG. 4, in the first processing surface 1 of the first processing member 10, a groove-like depression 13 extended toward an outer side from the central part of the first processing member 10, namely in a radius direction, may be formed. The depression 13 may be, as a plane view, curved or spirally extended on the first processing surface 1 as shown in FIG. 4(B), or, though not shown in the drawing, may be extended straight radially, or bent at a right angle, or jogged; and the depression may be continuous, intermittent, or branched. In addition, this depression 13 may be formed also on the second processing surface 2, or on both the first and second processing surfaces 1 and 2. By forming the depression 13 as mentioned above, the micro-pump effect can be obtained so that the fluid to be processed may be sucked into between the first and second processing surfaces 1 and 2.

It is preferable that the base edge of this depression 13 reach the inner periphery of the first processing member 10. The front edge of the depression 13 is extended to the direction of the outer periphery of the first processing surface 1; the depth thereof is made gradually shallower (smaller) from the base edge to the front edge.

Between the front edge of the depression 13 and the outer peripheral of the first processing surface 1 is formed a flat plane 16 not having the depression 13.

The foregoing opening d20 is arranged preferably at a position opposite to the flat surface 16 of the first processing surface 1.

The opening is arranged especially preferably at a position opposite to the flat surface 16 located in the downstream (outside in this case) of a position where the direction of flow upon introduction by the micro-pump effect is changed to the direction of a spiral and laminar flow formed between the processing surfaces. Specifically, in FIG. 4(B), a distance n from the front edge of the depression 13 arranged in the first processing surface 1 in the radius direction is preferably about 0.5 mm or more. With this, mixing of a plurality of fluids to be processed and separation of the microparticles therefrom can be effected under the condition of a laminar flow.

Shape of the opening part d20 may be circular as shown in FIG. 4(B) and FIG. 5(B), or a concentric circular ring of annular shape which encircles the central opening of the processing surface 2 having a form of a ring-like disk as shown by dotted lines in FIG. 4(B).

This second introduction part d2 may have directionality. For example, as shown in FIG. 5(A), the direction of introduction from the opening d20 of the second processing surface 2 is inclined at a predetermined elevation angle (θ1) relative to the second processing surface 2. The elevation angle (θ1) is set at more than 0° and less than 90°, and when the reaction speed is high, the angle (θ1) is preferably set at from 1° and more to 45° or less.

In addition, as shown in FIG. 5(B), introduction from the opening d20 of the second processing surface 2 has directionality in a plane along the second processing surface 2. The direction of introduction of this second fluid to be processed is in the outward direction departing from the center in a radial component of the processing surface and in the forward direction in a rotation component of the fluid between the rotating processing surfaces. In other words, a predetermined angle (θ2) exists facing the rotation direction R from a reference line g, which is the line to the outward direction and in the radius direction passing through the opening d20. This angle (θ2) is also set preferably at from more than 0° to less than 90°.

This angle (θ2) can vary depending on various conditions such as the type of fluid, the reaction speed, viscosity, and the rotation speed of the processing surface. In addition, it is also possible not to give the directionality to the second introduction part d2 at all.

In the embodiment shown in FIG. 3, kinds of the fluid to be processed and numbers of the flow path thereof are set two respectively; but they may be three or more. In the embodiment shown in FIG. 3, the second fluid to be processed is introduced between the processing surfaces 1 and 2 from the second introduction part d2; but this introduction part may be arranged in the first processing member 10 or in both. Alternatively, a plurality of introduction parts may be arranged relative to one fluid to be processed. The opening for introduction arranged in each processing member is not particularly restricted in its form, size, and number; and these may be changed as appropriate. The opening for introduction may be arranged just before the first and second processing surfaces 1 and 2 or in the side of further upstream thereof.

Meanwhile, because it is good enough only if the processing could be effected between the processing surfaces 1 and 2, in contrast to the foregoing method, a method wherein the second fluid to be processed is introduced from the first introduction part d1 and a solution containing the first fluid to be processed is introduced from the second introduction part d2 may also be used. That is, the expression "first" or "second" for each fluid has a meaning for merely discriminating an $n^{th}$ fluid among a plurality of the fluids present; and therefore, a third or more fluids can also exist.

It is thought that, in the abovementioned apparatus, by forcibly mixing the zinc oxide separating solvent and the raw material solution between the processing surfaces 1 and 2 shown in FIG. 3, single crystalline zinc oxide nanoparticles are generated because great energy due to an acid-base reaction is instantaneously input in the zinc oxide nanoparticles separated between the processing surfaces. It is therefore preferable that the zinc oxide separating solvent is highly acidic and the raw material solution is highly basic, and further, it is more preferable that the pH of the zinc oxide separating solvent is less than 1 and the pH of the raw material solution is more than 14.

With the abovementioned apparatus, the first processing surface 1 and the second processing surface 2 arranged facing to each other of the processing members 10 and 20 are both circular, and the space between the processing surfaces 1 and 2 thereby forms a circular space. However, only one (for example, only the second processing surface 2) may be made circular, and the other (for example, only the first processing surface 1) may be made planar. In addition, the first fluid to be processed is introduced in the way that inside of the circular space between the processing surfaces 1 and 2 is used as the first introduction part d1, and the introduced first fluid to be processed runs in the way that the first introduction part d1 is made as an upstream and the outside of the circle is made as a downstream, but in contrast thereto, the fluid may run in the way that the outside of the circle is made as an upstream and the inside of the circle is made as a downstream. Similarly, the second fluid to be processed is introduced through the opening d20 of the second introduction part d2, and runs in the way that the outside of the circle is made as a downstream, but in contrast thereto, the fluid may run in the way that the inside of the circle is made as a downstream.

The mixed fluid after mixing the material fluid and the zinc oxide separating solvent by using the fluid processing apparatus is basic, and preferably has a pH of 8.6 to 14, and more preferably has a pH of 12 to 14.

In addition, when the pH of the mixed fluid after mixing the material fluid and the zinc oxide separating solvent is more than 8.6, zinc compounds (such as zinc sulfate and zinc hydroxide) different from zinc oxide are separated in fewer cases.

Particularly, when the pH of the mixed fluid is 12 or more and 14 or less, all of the zinc oxide nanoparticles obtained are single-crystallized, which is preferable.

In addition, the method for adjusting the pH of the mixed fluid is not particularly limited. pH adjustment may be carried out by adjusting the composition of the zinc oxide separating solvent and/or raw material solution so that the pH of the mixed fluid falls in the abovementioned range or by changing the flow rate and temperature of introduction into the fluid processing apparatus and the operating conditions of the fluid processing apparatus.

In the present invention, it is essential to prepare a zinc oxide separating solvent by homogeneously mixing an acidic substance with a solvent containing at least alcohol. While the homogeneous mixing is effected by stirring using a rotary disperser, stirring energy is generally defined by equation 1.

$$\text{Stirring energy} = Np \cdot \rho \cdot n^3 \cdot d^5 \cdot t \quad \text{(Equation 1)}$$

Np: Power factor (dimensionless constant calculated from experimental data)
ρ: Density of zinc oxide separating solvent
n: Rotation number of rotor
d: Rotor diameter
t: Stirring time By changing at least any one of the parameters ρ, n, d, and t of equation 1, zinc oxide nanoparticles to be generated can be controlled in single crystal ratio.

EXAMPLES

Hereinafter, the present invention will be explained in more detail by Examples; but the present invention is not limited only to these Examples.

In the following Examples, solution A means a first fluid to be processed that is introduced from the first introduction part d1 of the apparatus shown in FIG. 3, and solution B means a second fluid to be processed that is introduced through the second introduction part d2 of the same apparatus.

Example 1

As the rotary disperser 100 shown in FIG. 1, Cleamix (manufactured by M. Technique Co., Ltd.) was used to prepare a zinc oxide separating solvent and a raw material solution.

Specifically, an acidic substance and alcohol were placed in Cleamix based on the composition of the zinc oxide separating solvent shown in Example 1 of Table 1, and were homogeneously mixed under a nitrogen atmosphere by stirring for 30 minutes with a preparation temperature of 50° C. and a rotation number of the rotor of 10000 rpm to prepare the zinc oxide separating solvent.

In addition, zinc oxide nanoparticle raw material and a basic solvent were placed in Cleamix based on the composition of the raw material solution shown in Example 1 of Table 1, and were homogeneously mixed under a nitrogen atmosphere by stirring for 30 minutes with a preparation temperature shown in Table 1 and a rotation number of the rotor of 20000 rpm, and the zinc oxide nanoparticle raw material was dissolved into the basic solvent to prepare the raw material solution.

The abbreviations used in Table 1 are as follows: ZnO; zinc oxide, $ZnCl_2$; zinc chloride, MeOH; methanol, EtOH; ethanol, IPA; isopropanol, KOH; potassium hydroxide, NaOH; sodium hydroxide, $Li(OH)_2$; lithium hydroxide, $H_2SO_4$; sulfuric acid, $HNO_3$; nitric acid, and HCl; hydrochloric acid.

TABLE 1

| | | Composition of zinc oxide separating solvent (solution A) (pH <1 in all) | | | | Composition of raw material solution (solution B)(pH >14 in all) | | | | | |
|---|---|---|---|---|---|---|---|---|---|---|---|
| | | Acidic substance/ composition [wt %] | | Alcohol/ composition [wt %] | | ZnO nanoparticle raw material/ composition [wt %] | | Basic solvent/ composition [wt %] | | | Preparation temperature [° C.] |
| Example | 1 | $H_2SO_4$ | 5.48 | MeOH | 94.52 | ZnO | 5.0 | NaOH | 45.6 | Pure water | 49.4 | 75.0 |
| | 2 | $H_2SO_4$ | 5.48 | MeOH | 94.52 | ZnO | 5.0 | NaOH | 45.6 | Pure water | 49.4 | 75.0 |
| | 3 | $H_2SO_4$ | 1.94 | MeOH | 98.06 | ZnO | 3.0 | KOH | 35.0 | Pure water | 62.0 | 75.0 |
| | 4 | $H_2SO_4$ | 1.94 | MeOH | 98.06 | ZnO | 3.0 | KOH | 35.0 | Pure water | 62.0 | 75.0 |
| | 5 | $H_2SO_4$ | 1.94 | MeOH | 98.06 | ZnO | 3.0 | KOH | 35.0 | Pure water | 62.0 | 50.0 |
| | 6 | $HNO_3$ | 2.50 | MeOH | 97.50 | ZnO | 3.0 | NaOH | 25.0 | Pure water | 72.0 | 50.0 |
| | 7 | $HNO_3$ | 2.50 | MeOH | 97.50 | ZnO | 3.0 | NaOH | 25.0 | Pure water | 72.0 | 35.0 |
| | 8 | HCl | 5.48 | EtOH | 94.52 | $ZnCl_2$ | 2.0 | $Li(OH)_2$ | 25.0 | Pure water | 73.0 | 50.0 |
| | 9 | $H_2SO_4$ | 5.48 | IPA | 94.52 | ZnO | 5.0 | KOH | 45.6 | Pure water | 49.4 | 50.0 |
| | 10 | HCl | 5.48 | EtOH | 94.52 | $ZnCl_2$ | 2.0 | $Li(OH)_2$ | 25.0 | Pure water | 73.0 | 35.0 |
| Comparative Example | 1 | $HNO_3$ | 2.50 | MeOH | 97.50 | ZnO | 3.0 | NaOH | 25.0 | Pure water | 72.0 | 50.0 |
| | 2 | $H_2SO_4$ | 5.48 | IPA | 94.52 | ZnO | 5.0 | KOH | 45.6 | Pure water | 49.4 | 35.0 |

| | | Introduction flow rate | | Introduction temperature | | Discharged solution | | Single crystal ratio [%] | Particle diameter [nm] | Crystallite diameter [nm] |
|---|---|---|---|---|---|---|---|---|---|---|
| | | Solution A [ml/min] | Solution B [ml/min] | Solution A [° C.] | Solution B [° C.] | pH | Temperature [° C.] | | | |
| Example | 1 | 600 | 25 | 50 | 25 | 12.9 | 33.9 | 100.0 | 5.4 | 5.4 |
| | 2 | 500 | 25 | 50 | 25 | 13.8 | 32.4 | 100.0 | 4.6 | 4.6 |
| | 3 | 800 | 25 | 30 | 50 | 12.7 | 29.4 | 100.0 | 5.3 | 5.3 |
| | 4 | 900 | 25 | 30 | 25 | 9.6 | 28.6 | 74.0 | 19.6 | 8.6 |
| | 5 | 950 | 25 | 30 | 25 | 7.1 | 28.4 | 14.3 | 54.3 | 13.6 |
| | 6 | 600 | 25 | 30 | 25 | 12.6 | 26.4 | 100.0 | 4.9 | 4.9 |
| | 7 | 650 | 25 | 30 | 25 | 7.1 | 27.4 | 1.2 | 19.3 | 15.6 |
| | 8 | 500 | 25 | 25 | 25 | 8.6 | 34.6 | 74.0 | 13.2 | 9.6 |
| | 9 | 500 | 25 | 25 | 50 | 7.1 | 34.6 | 8.9 | 54.6 | 12.3 |
| | 10 | 500 | 25 | 25 | 35 | 8.6 | 32.7 | 1.8 | 54.6 | 2.1 |
| Comparative Example | 1 | 700 | 25 | 30 | 25 | 5.6 | 26.9 | 0.0 | 164.3 | 0.3 |
| | 2 | 500 | 25 | 15 | 25 | 6.3 | 27.4 | 0.0 | 213.1 | 1.6 |

Next, the prepared zinc oxide separating solvent and the prepared raw material solution were mixed by the fluid processing apparatus shown in FIG. 3. Specifically, while the fluid processing apparatus was operated with a rotation number of the processing member 10 of 17000 rpm and the back pressure of 0.02 MPaG, the zinc oxide separating solvent as the first fluid to be processed and the raw material solution as the second fluid to be processed were introduced between the processing surfaces 1 and 2 and mixed in the thin film fluid formed therebetween. A discharged solution containing zinc oxide nanoparticles (hereinafter, a dispersion solution of zinc oxide nanoparticles) was discharged from between the processing surfaces 1 and 2 of the fluid processing apparatus.

As the introduction temperatures of the first fluid to be processed and the second fluid to be processed, the respective temperatures thereof were measured just before introduction into the processing apparatus (more specifically just before introduction between the processing surfaces 1 and 2).

In addition, because it is difficult to measure the pH of the mixed fluid just after mixing of the material fluid and the zinc oxide separating solvent, the pH of the dispersion solution of zinc oxide nanoparticles discharged from between the processing surfaces 1 and 2 of the fluid processing apparatus was measured and adjusted so that the pH of the discharged solution shows basicity.

For the pH measurement, a pH meter of Model number D-51 manufactured by HORIBA, Ltd. was used. Before introducing each fluid to be processed into the fluid processing apparatus, the pH of the fluid to be processed was measured at room temperature. In addition, the pH of the dispersion solution of zinc oxide nanoparticles discharged from the said apparatus was measured at room temperature.

From the dispersion solution of zinc oxide nanoparticles discharged from the fluid processing apparatus, dry powders and a wet cake sample were prepared. The preparation was performed according to a conventional method for this type of processing as the preparation method, and the discharged dispersion solution of zinc oxide nanoparticles were recovered, and subjected to filtration through a Buchner funnel lined with hardened filter paper, and then washing and filtration were repeated 7 times to effect separation, and one was dried to obtain dry powders. The other was subjected to a MeOH substitution and filtered through a Büchner funnel lined with hardened filter paper to obtain a wet cake sample.

Preparation of TEM Observation Sample and TEM Observation Results:

The wet cake of zinc oxide nanoparticles after washing obtained in Example was dispersed in ethylene glycol, and further diluted to 100 times with methyl ethyl ketone (MEK). The obtained dilution was allowed to drip onto a collodion film and dried to obtain a TEM observation sample.

Preparation of STEM Observation Sample and TEM Observation Results:

A dispersion solution obtained by dispersing the wet cake of zinc oxide nanoparticles after washing obtained in Example in ethylene glycol was allowed to drip onto a microgrid and dried to obtain a STEM observation sample.

Figure 7:
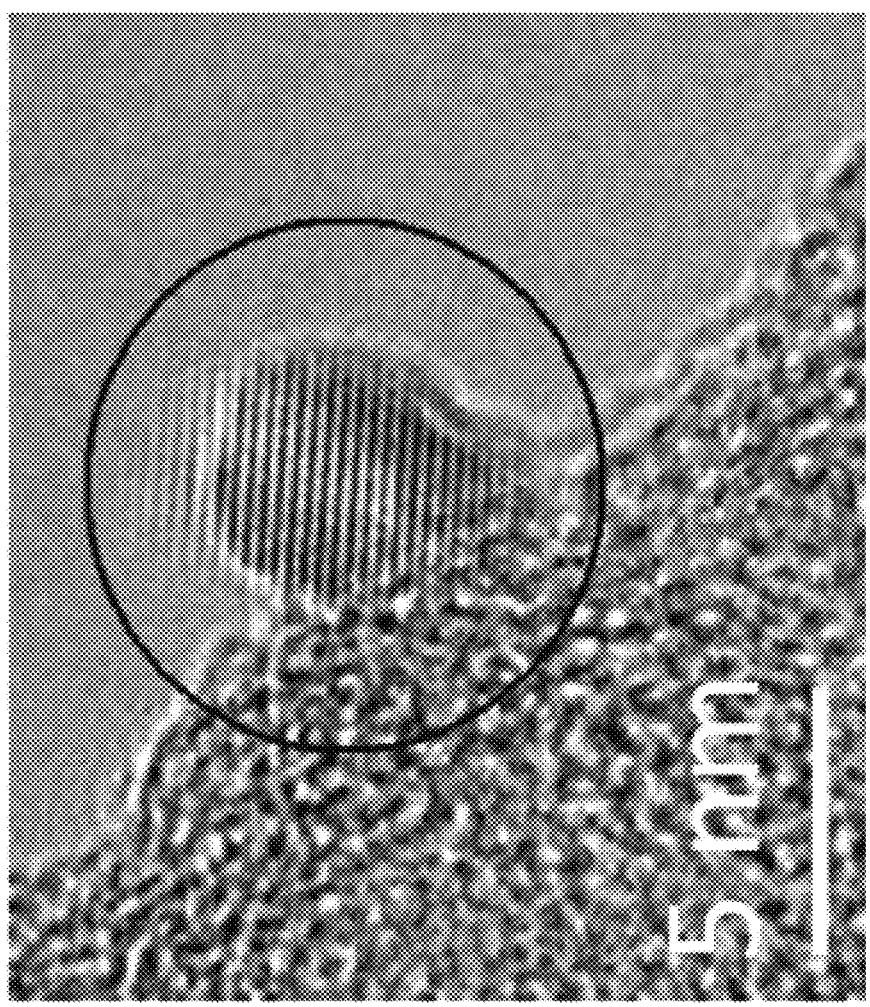

FIG. 6(A) to FIG. 6(C) show TEM pictures of the zinc oxide nanoparticles prepared in Example 1. FIG. 7 shows a STEM picture of the zinc oxide nanoparticle prepared in Example 1. As a result of the TEM and STEM observations, zinc oxide nanoparticles having a primary particle diameter of about 3 to 8 nm were observed.

Transmission Electron Microscope:

Observation by the transmission electron microscope (TEM) was made by using the transmission electron microscope JEM-2100 (manufactured by JEOL Ltd.). The observation condition with the acceleration voltage of 80 kV was used. The particle diameter shown in Table 1 was the average value of the particle diameter measurements of 100 particles obtained in the TEM observation.

Figure 9:
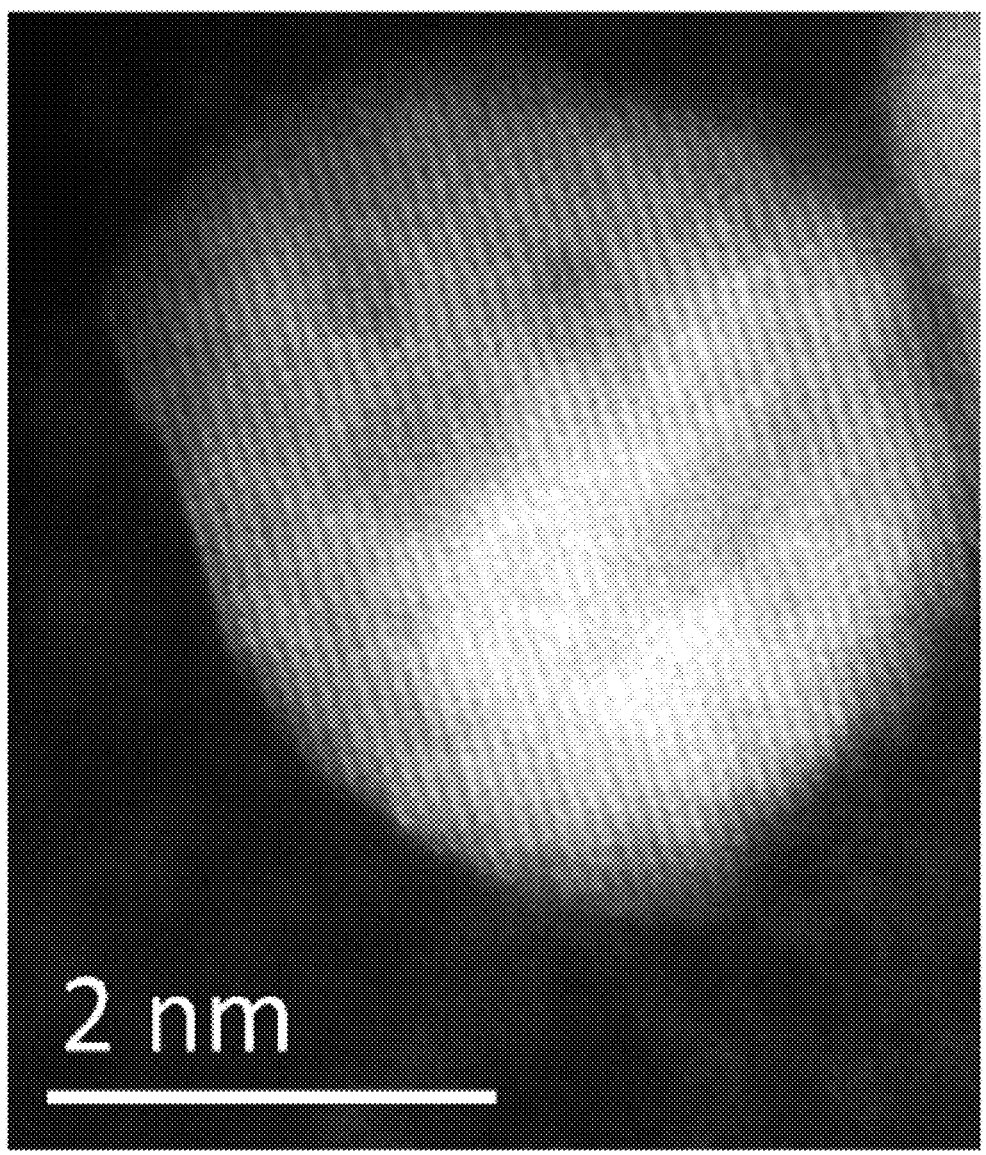
Figure 10:
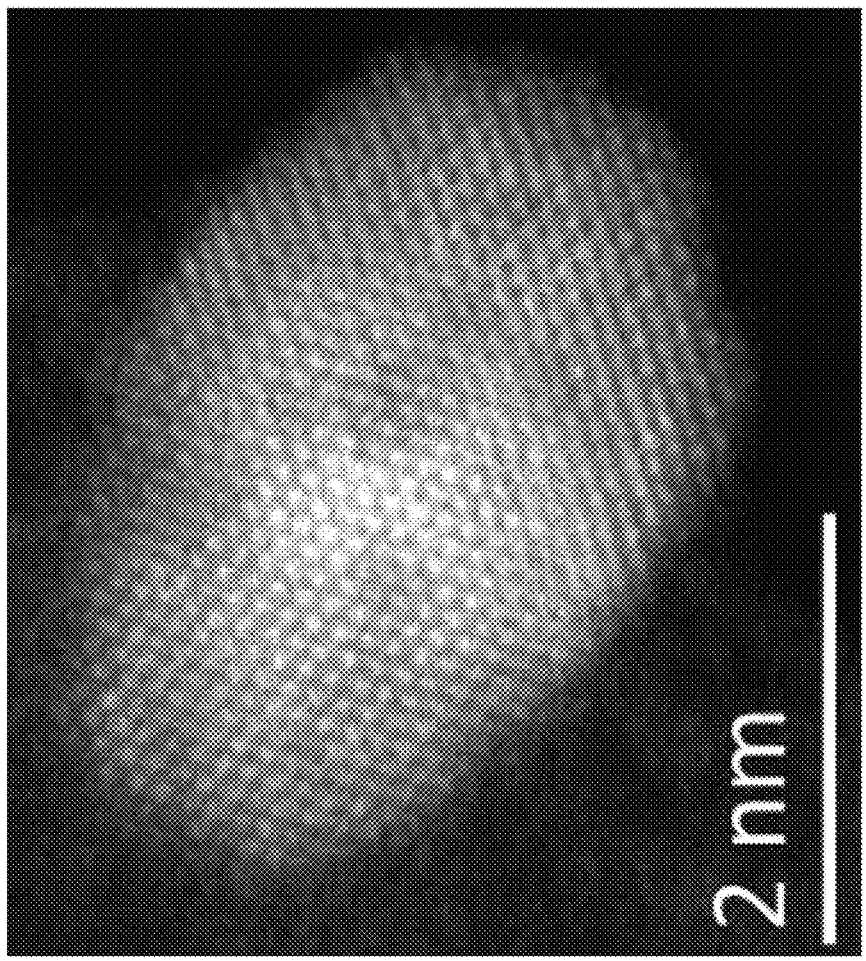

Observation by the Scanning Transmission Electron Microscope:

Observation by the scanning transmission electron microscope (STEM) was made by using the scanning transmission electron microscope JEM-ARM200F (UHR) manufactured by JEOL Ltd. The observation condition with the acceleration voltage of 80 kV was used for observation. The observation was made in a TEM mode in FIG. 7 (Example 1), and in FIG. 9 (Example 2) and FIG. 10 (Example 3), in a dark field measurement mode.

Measurement of the X-Ray Diffraction:

Measurement of the X-ray diffraction (XRD) was made by using the powder X-ray diffraction measurement instrument X'pert PRO MPD (XRD; manufactured by Panalytical Business Unit of Spectris Co., Ltd.). The measurement conditions were as follows: measurement range of 10 to 100°/2θ, Cu anticathode, tube voltage of 45 kV, tube current of 40 mA, and scanning speed of 1.6°/min.

Figure 8:
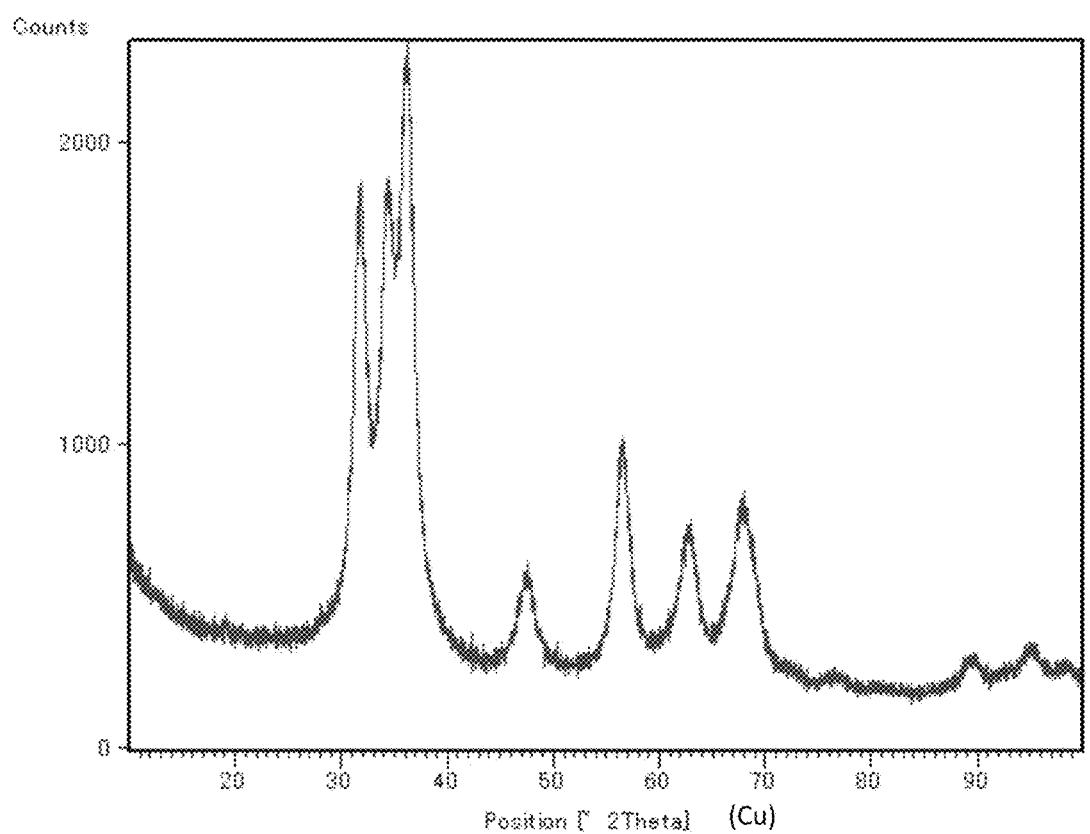

XRD Measurement Results:

XRD measurement was made by using the dry powders of zinc oxide nanoparticles obtained in each Example. The XRD measurement results of Example 1 are shown in FIG. 8. In the results of the XRD measurement, peaks coincident with those of zinc oxide were observed, and it was confirmed that zinc oxide was prepared. In addition, by using the peak obtained near to 47°, the crystallite diameter was calculated by the Scherrer's equation using a measurement result of the silicon polycrystal plate.

Evaluation of being Single Crystals:

An illustrative example of a method for evaluating that the zinc oxide nanoparticles obtained by Example are single crystals includes electronmicroscopy by a transmission electron microscope (TEM) or a scanning electron microscope (SEM) and a method of comparing the particle diameter obtained by TEM observation with the measurement result of crystallites by using XRD, and here, the obtained zinc oxide nanoparticles were observed by a STEM, a calculation was made by single crystal ratio=B/A×100(%) based on the number A of observed zinc oxide nanoparticles and the number B of zinc oxide nanoparticles observed as single crystals therein, and the ratio was evaluated. Meanwhile, in electronmicroscopy, the criteria as to whether or not the individual particles are single crystals is as follows: ones with lattice fringes (atomic arrangement in crystal) observed in one direction were recognized as single crystals; and ones with disordered lattice fringes or with grain boundaries observed were recognized as not to be single crystals.

Examples 2 to 10 and Comparative Examples 1 to 2

Similarly to Example 1, the present invention was carried out with each combination of the composition, introduction flow rates, and introduction temperatures for the zinc oxide separating solvent and raw material solution shown in Table 1, dry powders and a wet cake sample were prepared from the dispersion solution of zinc oxide nanoparticles discharged from the fluid processing apparatus, and as a result of preparing samples by the same procedures as those of Example 1 and observing and measuring the same, the results as shown in Table 1 were obtained. In addition, processing conditions that are not included in Table 1 are the same as those of Example 1.

results of Rank 1 to Rank 4 were obtained. In Table 2, the zinc oxide nanoparticles obtained under the conditions of a preparation time of 30 minutes and a preparation temperature of 50° C. correspond to Example 1 in Table 1.

TABLE 2

| Preparation temperature | Preparation time (stirring energy) [Unit: minute] | | | | | | |
|---|---|---|---|---|---|---|---|
| [Unit: ° C.] | 1 | 10 | 20 | 25 | 30 | 35 | 40 |
| 30 | Rank 4 | Rank 4 | Rank 4 | Rank 4 | Rank 4 | Rank 4 | Rank 4 |
| 40 | Rank 4 | Rank 4 | Rank 4 | Rank 4 | Rank 3 | Rank 3 | Rank 3 |
| 50 | Rank 4 | Rank 4 | Rank 4 | Rank 4 | Rank 1 | Rank 1 | Rank 1 |
| 60 | Rank 4 | Rank 4 | Rank 4 | Rank 3 | Rank 1 | Rank 1 | Rank 1 |
| 70 | Rank 4 | Rank 4 | Rank 3 | Rank 2 | Rank 1 | Rank 1 | Rank 1 |

Rank 1: Single crystal ratio of 100% (observed zinc oxide nanoparticles were all single crystals)
Rank 2: 70% ≤ Single crystal ratio < 100%
Rank 3: 0% < Single crystal ratio < 70%
Rank 4: Single crystal ratio of 0% (no single crystalline zinc oxide nanoparticles were observed)

As shown in Table 1, it turned out that, in Examples 2 to 10 the discharged solution of which is basic, single crystalline zinc oxide nanoparticles were contained in the discharged dispersion solution of zinc oxide nanoparticles. In other words, single crystalline zinc oxide nanoparticles were generated in Examples 2 to 10.

On the other hand, as shown in Comparative Example 1 and Comparative Example 2, when the discharged solution was not basic, no single crystalline zinc oxide nanoparticles were contained in the discharged dispersion solution of zinc oxide nanoparticles.

In each Example, there was seen a tendency that the higher the pH of the discharged solution, the higher the single crystal ratio, and as seen in Example 1, Example 2, Example 3, Example 4, Example 6, and Example 8, when the pH of the discharged solution was 8.6 or more, the single crystal ratio was relatively high.

Particularly, as seen in Example 1, Example 2, Example 3, and Example 6, when the pH of the discharged solution was 12 or more, observed zinc oxide nanoparticles were all single crystals.

Figure 11:
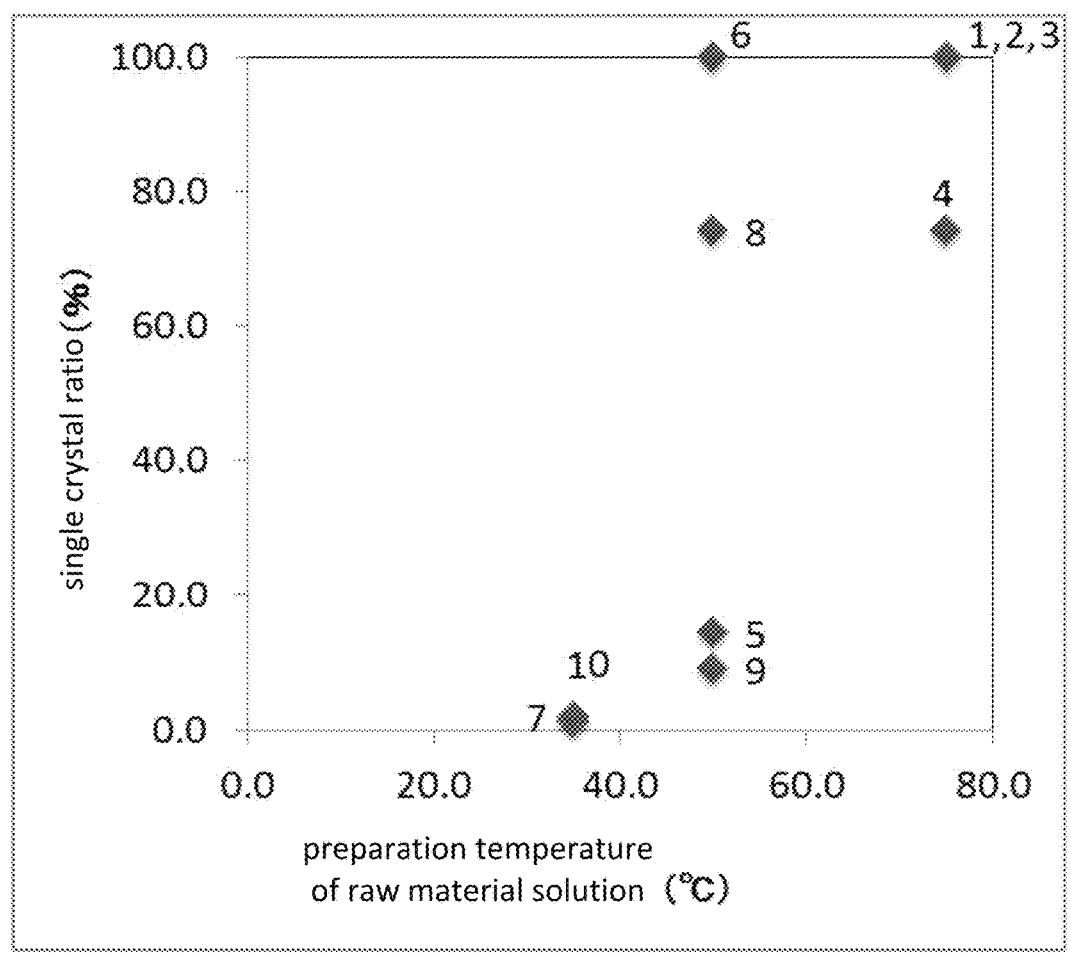

In addition, the relationship between the preparation temperature of the raw material solution and the single crystal ratio is as in FIG. 11, and when the preparation temperature of the raw material solution was 50° C. or more, the single crystal ratio was improved, and when the preparation temperature of the raw material solution was 75° C., the single crystal ratio was further improved. The numerals described in FIG. 11 show the numbers of Examples in Table 1.
Preparation of Zinc Oxide Separating Solvent:

In the present invention, it is essential to prepare a zinc oxide separating solvent by homogeneously mixing an acidic substance with a solvent containing at least alcohol, and this point will be described hereunder in detail.

The same conditions as those of Example 1 in the foregoing were used for the composition of each of the zinc oxide separating solvent and raw material solution, the preparation of the raw material solution, the flow rate and temperature of introduction into the fluid processing apparatus, and the operating conditions of the fluid processing apparatus, and only the preparation time and preparation temperature among the preparation conditions of the zinc oxide separating solvent were changed to separate nanoparticles, and as a result of calculating the single crystal ratio similarly to Examples 1 to 10, as shown in Table 2, the It can be understood from the results in Table 2 that by setting the preparation time of the zinc oxide separating solvent to 20 minutes or more or by setting the preparation temperature thereof to 40° C. or more, the acidic substance was mixed with the solvent containing at least alcohol, which consequently contributes to the generation of single crystalline zinc oxide nanoparticles. In addition, when the preparation time was set to 25 minutes and the preparation temperature was set to 70° C., the single crystal ratio was 70% or more, and when the preparation time was set to 30 minutes or more and the preparation temperature was set to 50° C. or more, obtained zinc oxide nanoparticles were all single crystals. This way, it was confirmed that the preparation of the zinc oxide separating solvent contributes to the generation of single crystalline zinc oxide nanoparticles.

As described above, homogeneously mixing an acidic substance with a solvent containing at least alcohol when preparing a zinc oxide separating solvent enables separating single crystalline zinc oxide nanoparticles. The detailed mechanism is not known, but it is obvious from Examples (Rank 1, Rank 2, and Rank 3) and Comparative Examples (Rank 4) in the abovementioned Table 2 and their discussion that the state of the zinc oxide separating solvent introduced between the processing surfaces has a great influence on the separation of single crystalline nanoparticles.

The abovementioned Table 2 is an example in which the stirring energy was increased and decreased by the preparation time t. As can be understood from Table 2, the single crystal ratio of obtained single crystalline zinc oxide nanoparticles can be controlled by the amount of stirring energy input during preparation of the zinc oxide separating solvent. Here, separating zinc oxide nanoparticles that are all single crystals, in other words, the single crystal ratio being 100% is also an example of the abovementioned control.

Next, another control example will be described. In Example 1, the zinc oxide separating solvent was prepared by stirring of 30 minutes with a rotation number of the rotor of 10000 rpm in order to make the single crystal ratio 100%; but when, for example, the rotation number of the rotor is set to 5000 rpm, which is a half of that of Example 1, to perform preparation, the preparation time is set to $2^3=8$ times of 240 minutes according to equation 1. Alternatively, by increasing the rotor diameter $2^{5/3}=3.17$ times, stirring energy to be input during preparation of the zinc oxide separating solvent becomes equal, and the same results as those of Example 1 are obtained. Of course, both of the preparation time and rotor diameter may be set as long as equation 1 is satisfied.

Meanwhile, as can also be understood from the fact that the separation temperature is obviously not included in equation 1, for controlling the single particle ratio, the preparation temperature needs to be set independently of the parameters ρ, n, d, and t of equation 1 described above.

Addition:

Hereinafter, the invention disclosed in the description of the present application will be added.

The method for producing single crystalline zinc oxide nanoparticles according to any one of claims 1 to 16, wherein the zinc oxide separating solvent is prepared at 40° C. or more.

The method for producing single crystalline zinc oxide nanoparticles according to any one of claims 1 to 16, wherein a preparation time of 20 minutes or more is set for the zinc oxide separating solvent.

1 first processing surface
2 second processing surface
10 first processing member
11 first holder
20 second processing member
21 second holder
d1 first introduction part
d2 second introduction part
d20 opening

The invention claimed is:

1. A method for producing single crystalline zinc oxide nanoparticles comprising:
   preparing a zinc oxide separating solvent by homogeneously mixing an acidic substance with a solvent containing at least alcohol;
   mixing, between processing surfaces which are disposed facing each other so as to be able to approach and separate from each other and at least one of which rotates relative to the other, the prepared zinc oxide separating solvent and a raw material solution that is obtained by mixing a zinc oxide nanoparticle raw material with a basic solvent, or that is basic as a result of mixing and dissolving a zinc oxide nanoparticle raw material with and into a solvent; and
   discharging a mixed fluid in which zinc oxide nanoparticles have separated out from between the processing surfaces, wherein
   the zinc oxide separating solvent and the raw material solution are mixed between the processing surfaces so that the mixed fluid becomes basic, and
   zinc oxide nanoparticles are generated under an acid-base reaction due to mixing of the acidic substance and the raw material solution.

2. The method for producing single crystalline zinc oxide nanoparticles according to claim 1, wherein the mixed fluid has a pH of 8.6 or more and 14 or less.

3. The method for producing single crystalline zinc oxide nanoparticles according to claim 2, wherein the mixed fluid has a pH of 12 or more and 14 or less.

4. The method for producing single crystalline zinc oxide nanoparticles according to claim 1, wherein the zinc oxide separating solvent has a pH of less than 1, and the raw material solution has a pH of more than 14.

5. The method for producing single crystalline zinc oxide nanoparticles according to claim 1, wherein the acidic substance is selected from the group consisting of hydrochloric acid, nitric acid, and sulfuric acid.

6. The method for producing single crystalline zinc oxide nanoparticles according to claim 1, wherein the alcohol is selected from the group consisting of methanol, ethanol, isopropyl alcohol, and tert-butanol.

7. The method for producing single crystalline zinc oxide nanoparticles according to claim 1, wherein the raw material solution is prepared at 50° C. or more.

8. The method for producing single crystalline zinc oxide nanoparticles according to claim 1, wherein for the basic solvent, a basic hydroxide is mixed with and/or dissolved into a solvent.

9. The method for producing single crystalline zinc oxide nanoparticles according to claim 8, wherein the basic hydroxide is an alkali metal hydroxide.

10. The method for producing single crystalline zinc oxide nanoparticles according to claim 9, wherein the alkali metal hydroxide is selected from the group consisting of sodium hydroxide, potassium hydroxide, and lithium hydroxide.

11. The method for producing single crystalline zinc oxide nanoparticles according to claim 1, wherein the zinc oxide nanoparticle raw material is a zinc compound soluble in the basic solvent.

12. The method for producing single crystalline zinc oxide nanoparticles according to claim 11, wherein the zinc compound is selected from at least one of the group consisting of zinc oxide, zinc chloride, zinc nitride, zinc hydroxide, and zinc sulfide.

13. The method for producing single crystalline zinc oxide nanoparticles according to claim 1, wherein one of the zinc oxide separating solvent and the raw material solution passes through between the processing surfaces while forming a thin film fluid,
   the other of the zinc oxide separating solvent and the raw material solution is introduced from an opening formed in at least any one of the processing surfaces between the processing surfaces through a separate introduction path independent of the flow path through which one of the zinc oxide separating solvent and the raw material solution is introduced between the processing surfaces, and
   the zinc oxide separating solvent and the raw material solution are mixed between the processing surfaces.

14. The method for producing single crystalline zinc oxide nanoparticles according to claim 1, which homogeneously mixes the acidic substance with the solvent containing at least alcohol using a rotary disperser, wherein
   the rotary disperser includes a rotor provided with a plurality of blades and a screen laid around the rotor and having a plurality of slits, and by at least one of the rotor and the screen rotating relative to the other, shear of a fluid is performed in a minute gap between an inner wall of the screen including the slit and the blade, and the fluid is discharged through the slit from inside to outside of the screen as an intermittent jet flow.

15. The method for producing single crystalline zinc oxide nanoparticles according to claim 1, wherein the zinc oxide nanoparticles to be generated are controlled in single crystal ratio by a preparation temperature of the zinc oxide separating solvent.

16. The method for producing single crystalline zinc oxide nanoparticles according to claim 1, wherein the zinc oxide nanoparticles to be generated are controlled in single crystal ratio by stirring energy that is input during preparation of the zinc oxide separating solvent.

17. The method for producing single crystalline zinc oxide nanoparticles according to claim 2, wherein the zinc oxide separating solvent has a pH of less than 1, and the raw material solution has a pH of more than 14.

18. The method for producing single crystalline zinc oxide nanoparticles according to claim 3, wherein the zinc oxide separating solvent has a pH of less than 1, and the raw material solution has a pH of more than 14.

19. The method for producing single crystalline zinc oxide nanoparticles according to claim 2, wherein the acidic substance is selected from the group consisting of hydrochloric acid, nitric acid, and sulfuric acid.

20. The method for producing single crystalline zinc oxide nanoparticles according to claim 3, wherein the acidic substance is selected from the group consisting of hydrochloric acid, nitric acid, and sulfuric acid.

* * * * *